US006549053B1

(12) United States Patent
Evans et al.

(10) Patent No.: US 6,549,053 B1
(45) Date of Patent: Apr. 15, 2003

(54) ADJUSTABLE OFFSET VOLTAGE CIRCUIT

(75) Inventors: Eric M. J. Evans, Headington (GB); Lawrence M. DeVito, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/915,616

(22) Filed: Jul. 26, 2001

(51) Int. Cl.[7] .................................................. H03L 5/00
(52) U.S. Cl. ........................................ 327/307; 327/318
(58) Field of Search ................................ 327/307, 318; 330/9; 375/318, 319

(56) References Cited

U.S. PATENT DOCUMENTS 5,439,765 A * 7/1995 Nagahori .................... 375/318
6,288,604 B1 * 9/2001 Shih et al. ...................... 330/9

* cited by examiner

Primary Examiner—Tuan T. Lam
Assistant Examiner—Hiep Nguyen
(74) Attorney, Agent, or Firm—Samuels. Gauthier & Stevens, LLP

(57) ABSTRACT

An adjustable offset voltage circuit is disclosed for applying an offset voltage to a differential voltage in a digital data receiver system. The circuit includes a pair of emitter follower units, and a pair of current generating units. The first emitter follower unit provides a first offset voltage, and the second emitter follower unit provides a second offset voltage. The first current generating unit provides a biasing current to the first emitter follower unit, and the second current generating unit provides a biasing current to the second emitter follower unit. The circuit also includes a pair of differential signal input ports, each of which is coupled to one of the first and second emitter follower units, and an offset adjustment unit for permitting offset adjustment of a differential output signal with respect to a differential input signal at the input ports.

18 Claims, 4 Drawing Sheets

ADJUSTABLE OFFSET VOLTAGE CIRCUIT

BACKGROUND OF THE INVENTION

The invention relates to offset voltage circuits, and particularly relates to offset voltage circuits for use in digital data receiver systems.

A digital data receiver system typically includes some threshold detection circuitry for distinguishing between a high (or binary one) signal, and a low (or binary zero) signal. If the signals are relatively clean with respect to noise, then the threshold detection circuitry may simply set the threshold value to zero volts differential, and signals above zero volts differential are detected as a binary one, and signals below zero volts differential are detected as a binary zero.

Many digital data receiver systems, such as those that may be used with fiber optic communication systems, suffer from the presence of noise in the receiver signal. The presence of noise becomes potentially problematic if the noise causes the signal to cross the threshold, e.g., zero volts differential, within a single bit of information. One approach to reducing the noise is to include a capacitor in the receiver system that would integrate the signal with respect to time. This approach, however, limits the data clock speed of the receiver circuit due to the time delay required by the capacitor.

In certain communication systems, the noise in the received signal has been found to disproportionately affect the high signal to a greater extent than it affects the low signal. For example in receiver systems that include either an optical preamplifier or an avalanche photo diode, the high signal has been found to generally have more noise than the low signal Another approach, therefore, is to lower the threshold voltage by an offset voltage (e.g., 100 mv differential) that is tailored to the needs of the particular receiver system. Such offset circuits, however, typically provide non-linear responses to changes in adjustment voltages due to the non-ideal and non-linear characteristics of transistors within the offset circuitry itself, making proper adjustment difficult to achieve. The use of such adjustable offset voltage circuits, therefore, may have remained limited due to difficulties in setting the offset to a desired voltage.

There is a need, therefore, for an improved digital data receiver system that efficiently and accurately distinguishes between high and low data signals at high clock speeds.

There is a further need for an improved offset voltage circuit that provides a linear response to adjustment voltage inputs.

SUMMARY OF THE INVENTION

An adjustable offset voltage circuit is disclosed for applying an offset voltage to a differential voltage in a digital data receiver system. The circuit includes a pair of emitter follower units, and a pair of current generating units. The first emitter follower unit provides a first offset voltage, and the second emitter follower unit provides a second offset voltage. The first current generating unit provides a biasing current to the first emitter follower unit, and the second current generating unit provides a biasing current to the second emitter follower unit. The circuit also includes a pair of differential signal input ports, each of which is coupled to one of the first and second emitter follower units, and an offset adjustment unit for permitting offset adjustment of a differential output signal with respect to a differential input signal at the input ports. In an embodiment, the offset adjustment unit includes a, degenerated differential pair of transistors.

BRIEF DESCRIPTION OF THE DRAWING

The following description may be further understood with reference to the accompanying drawing in which.

DETAILED DESCRIPTION OF THE INVENTION

Figure 1:
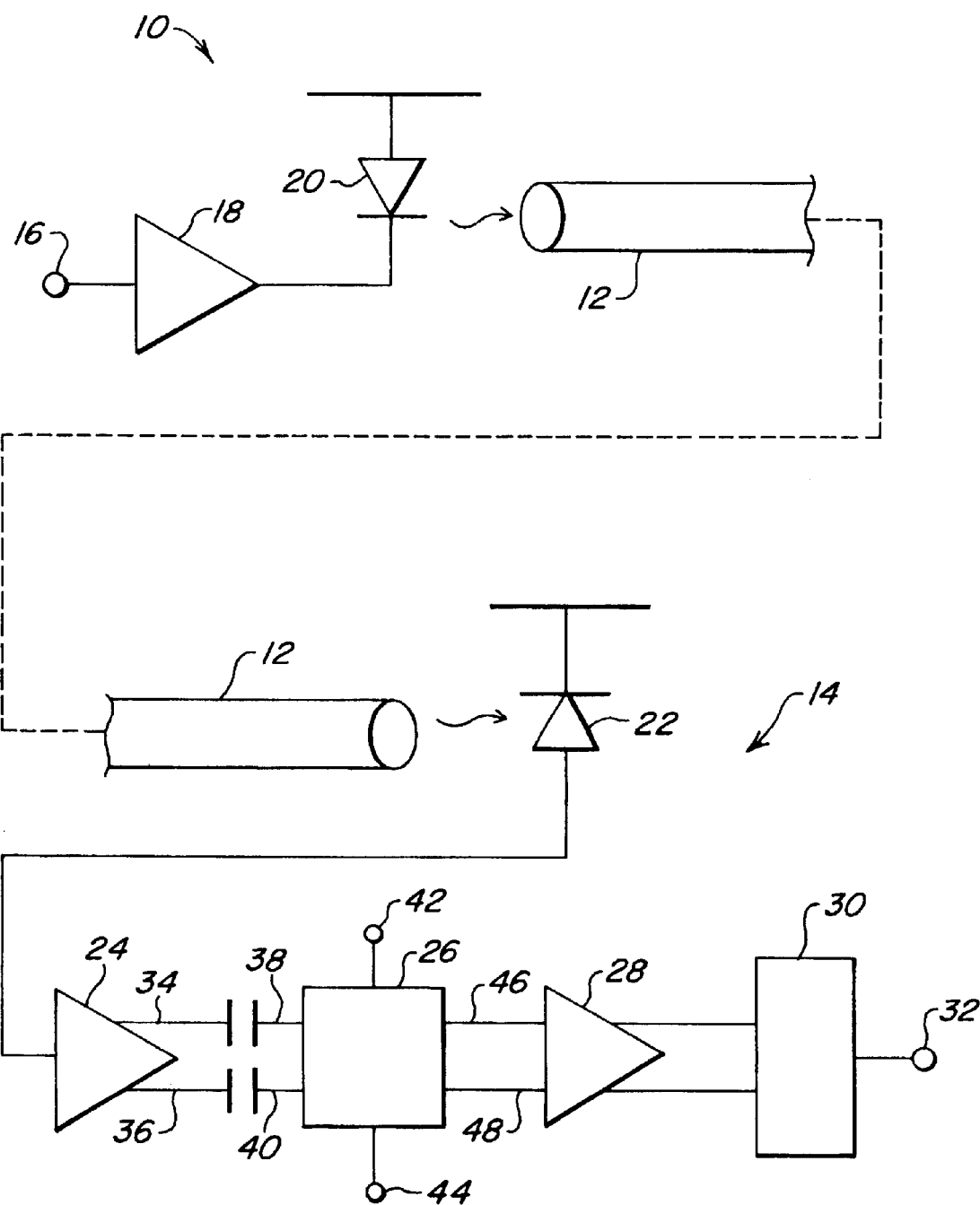
FIG. 1 shows an illustrative diagrammatic view of a system of the invention in a digital data transmitter and receiver circuit.

A circuit of the invention may be employed in a digital data transmission system as shown in FIG. 1. In particular, such a system may include a transmitter system 10, an optical fiber communication channel 12, and a receiver system 14. The transmitter system 10 includes a data transmitter input port 16, a laser diode driver 18, and a laser diode 20. The receiver system includes a photo diode 22, a transimpedance amplifier 24, an adjustable offset circuit of the invention 26, a limiting amplifier 28, and a clock and data recovery circuit 30 that produces digital data output at an output port 32.

The transimpedance amplifier 24 includes a positive data signal line 34, and a negative data signal line 36, that are coupled to a positive input (PIN) 38 of the adjustable offset circuit 26 and to a negative input (NIN) 40 of the circuit 26 respectively as shown. The offset circuit 26 may be adjusted by varying the voltage input to the offset adjust positive (SP) input 42 as well as the offset adjust negative (SN) input 44. The output offset positive signal (IN) 46 and the output offset negative signal (INB) 48 of the offset circuit 26 are coupled to the limiting amplifier 28 as shown in FIG. 1.

Generally, digital data is transmitted by the transmitter system 10, through the fiber optic cable 12, and received at the receiver system 14. The receiver system 14 must distinguish between high signals that represent binary one data, and low signals that represent binary zero data. This is achieved by the limiting amplifier 28, and the input to the limiting amplifier may be adjustably offset by the circuit 26 to reduce the potential for error due to signal noise that is disproportionately greater for either the positive or negative data signal.

Figure 2B:
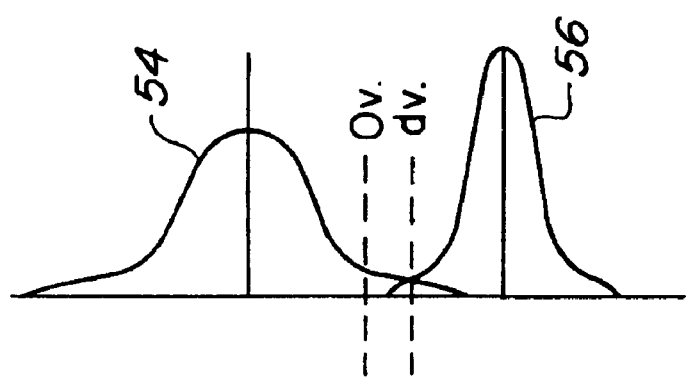
FIG. 2B shows an illustrative graphical view of the distribution of the data signals of FIG. 2A.
Figure 2A:
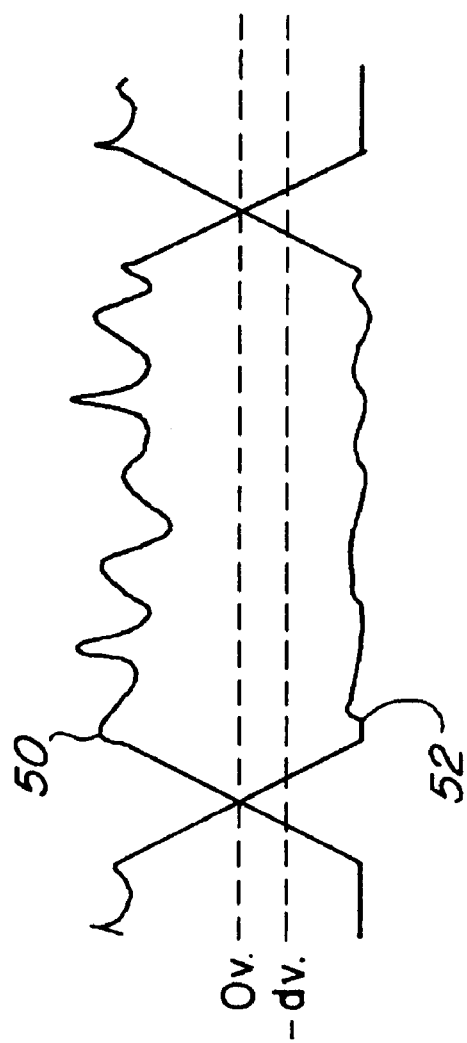
FIG. 2A shows an illustrative graphical view of an example of data signals that are received in a receiver circuit that includes a system of the invention.

For example, as shown in FIG. 2A, the high signal that represents binary one data 50 may include more noise than the low signal that represents binary zero data 52. If the threshold is set to zero volts, the noise on the high signal 50 may cause erroneous information to be received by the receiver system, for example, if the noise causes the high signal to drop below zero volts. The offset circuit of the invention permits the threshold to be lowered to a lower threshold of −d volts as shown to optimize the receiver's bit error rate. The probability distribution curves 54, 56 for the high and low signals 50 and 52 respectively are shown in FIG. 2B. The preferred value of −d is the point at which the distribution curve 54 crosses the distribution curve 56 as shown in FIG. 2B.

Adjustment of the offset circuit may be easily achieved by varying the offset adjust positive input (SP) 42, and the offset adjust negative input (SN) 44 to provide an offset voltage between the differential voltage signal inputs 38 and 40, and the differential output signal voltages 46 and 48.

Figure 3:
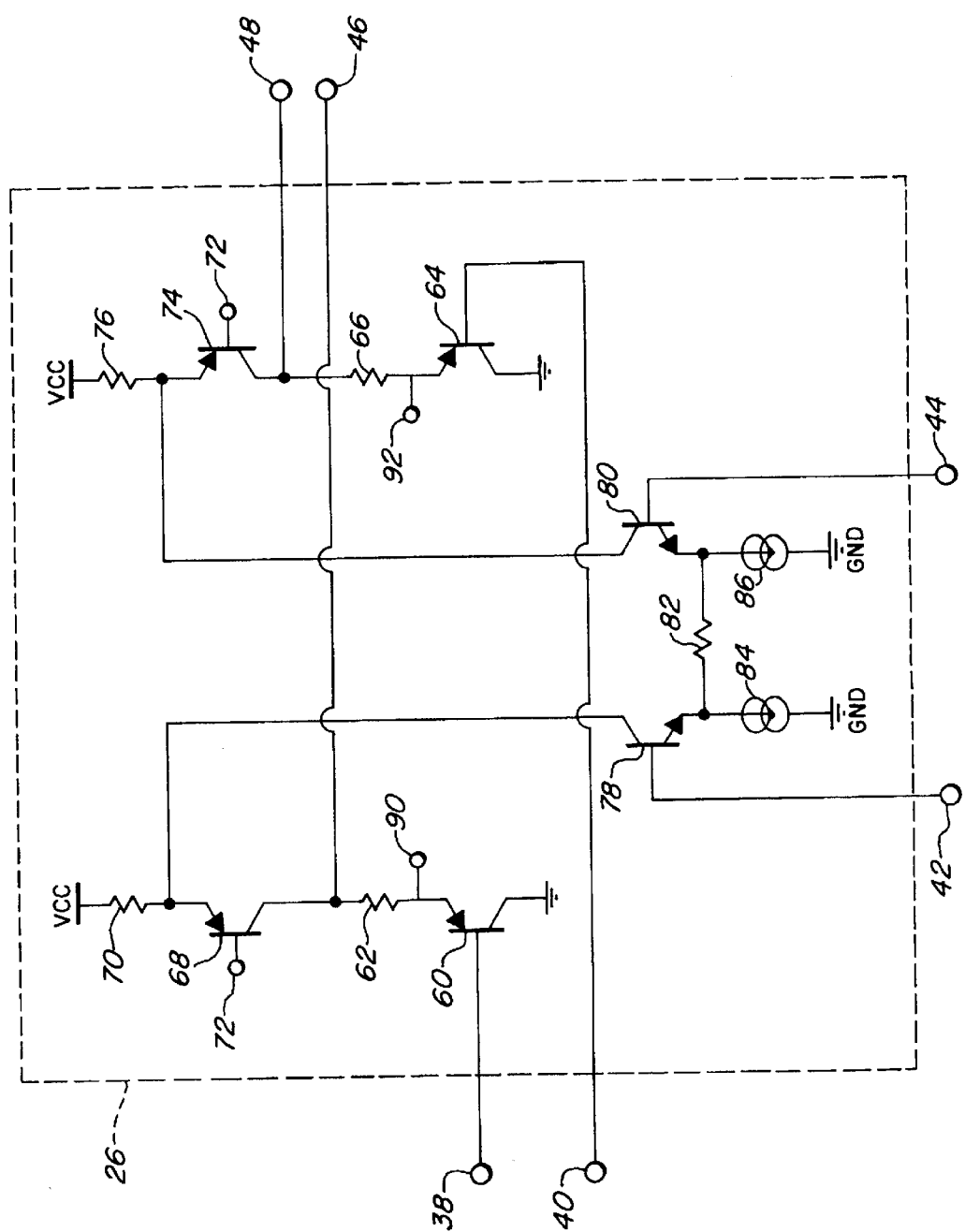
FIG. 3 shows an adjustable offset voltage circuit in accordance with an embodiment of the invention.

As shown in FIG. 3, an offset circuit in accordance with a specific embodiment of the invention includes a pair of emitter follower circuits for providing the offset voltages, a pair of current generating circuits for providing biasing currents, and a degenerated differential pair transconductance circuit for permitting the adjustment of the offset voltages.

The first emitter follower circuit includes a transistor 60 ($q_{60}$) and a series resistor 62 ($R_{62}$) that is coupled to the emitter of transistor 60 as shown. The base of transistor 60 is coupled to the positive input (PIN) 38 from the transimpedance amplifier 24, and the collector of transistor 60 is coupled to ground. Similarly, the second emitter follower circuit includes a transistor 64 ($q_{64}$) and a series resistor 66 ($R_{66}$) that is coupled to the emitter of transistor 64 as shown. The base of transistor 64 is coupled to the negative input (NIN) 40 from the transimpedance amplifier 24, and the collector of transistor 64 is coupled to ground.

The first current generating circuit includes a transistor 68 ($q_{68}$) and a series resistor 70 ($R_{70}$) that is coupled to the emitter of transistor 68 and to a voltage source (VCC) as shown. The base of transistor 68 is coupled to a bias voltage source (VB) 72, and the collector of transistor 68 is coupled to the resistor 62 of the first emitter follower circuit. The second current generating circuit includes a transistor 74 ($q_{74}$) and a series resistor 76 ($R_{76}$) that is coupled to the emitter of transistor 74 and to a voltage source (VCC) as shown. The base of transistor 74 is coupled to the bias voltage source (VB) 72, and the collector of transistor 74 is coupled to the resistor 66 of the second emitter follower circuit. The differential output offset signals 46 and 48 are provided at the collectors of the transistors 68 and 74 respectively as shown.

The degenerated differential pair transconductance circuit includes a pair of transistors 78 and 80 ($q_{78}$, $q_{80}$), the emitters of which are coupled to one another by a resistor 82 ($R_{82}$) and to a pair of current sources 84 and 86 respectively as shown. The collector of transistor 78 ($q_{78}$) is coupled to the emitter of transistor 68, and the offset adjust positive (SP) input 42 is coupled to the base of transistor 78. The collector of transistor 80 ($q_{80}$) is coupled to the emitter of transistor 74, and the offset adjust negative (SN) input 44 is coupled to the base of transistor 80.

The circuit shown in FIG. 3 is particularly robust against systematic offset errors that are typically present in bipolar transistor at varying currents, as well as process variations. This characteristic permits the voltage offset circuit to provide a predicable linear response to changes in the differential adjust inputs 42 and 44. Moreover, the voltage offset circuit is well suited for applications involving low voltage power supplies (e.g., 3.3 v.), as well as applications requiring relatively simple offset circuits that are efficient to manufacture. Finally, the circuit of FIG. 3 minimizes any additional parasitic capacitances that might be added to the critical nodes in a high-speed data path. Such parasitic capacitances might otherwise limit the maximum data rate of operation of the receiver system.

The circuit of FIG. 3 minimizes errors due to the varying voltage potentials that typically exist between transistor bases and emitters when biased at different collector currents. The delta base to emitter voltage ($\delta V_{be}$) represents the change in the base-emitter voltage for each bipolar transistor from the condition where the nodes SP and SN are at the same voltage, to the condition where there is a differential voltage applied across SP and SN. The delta base to emitter voltage ($\delta_{be}$) for a transistor may be expressed as $$\delta V_{be} = \frac{kT}{q} \text{Log}_N \left( \frac{I_C}{I_{C,SN=SP}} \right)$$

where k is Boltzman's constant, T is temperature in degrees Kelvin, q is the electronic charge, $I_c$ is the collector current flowing in the transistor and $I_{C,SN=SP}$ is the collector current flowing in the transistor when the voltage at SP is equal to the voltage at SN.

Initially, consider the case where $V_{SP}=V_{SN}$, and the inputs at nodes 38 and 40 are equal. In this case, $Is_1=Is_2=Is_0$, where $Is_1$ is the current into the collector of transistor 78, $Is_2$ is the current into the collector of transistor 80, and $Is_0$ is the current drawn by each of current sources 84 and 86. If it assumed that the current through resistor 62 ($I_{01}$) is equal to the current through resistor 66 ($I_{02}$), which for convenience will be referred to as the current $I_0$, and that the voltages at inputs 38 and 40 ($V_{PIN}$ and $V_{NIN}$) are each zero volts, then the voltages at nodes 46 and 48 ($V_{in}$ and $V_{inb}$ respectively) are provided by $V_{in}=V_{be,q60}+(I_{01}R_{62})$, and $V_{inb}=V_{be,q64}+(I_{02}R_{66})$. The total current through resistor 70 ($It_1$)=(VCC−(VB+$V_{be,q68}$))/$R_{70}$, and the total current through resistor 76 ($It_2$)=(VCC−(VB+$V_{be,q74}$))/$R_{76}$. Also, the current $I_{01}=It_1-Is_1$ and the current $I_{02}=It_2-Is_2$. The difference $V_{in}-V_{inb}$, therefore, equals zero since $I_{01}=I_{02}$, and $R_{62}=R_{66}$, and consequently $V_{be,q60}=V_{be,q64}$, and $V_{be,q68}=V_{be,q74}$.

When there is a differential voltage applied to nodes 42 and 44, and $Is_1>Is_2$, then $$It_1 = \frac{VCC - (Vb + V_{be,q68} + \delta V_{be,q68})}{R_{70}} \text{ and}$$

$$It_2 = \frac{VCC - (Vb + V_{be,q74} + \delta V_{be,q74})}{R_{76}}$$

The value $\delta V_{be,q68}$ will be negative (and will be equal to $\delta V_{be,q60}$) because when $Is_1$ increases, there is less current flow through transistor 68. Consequently, $I_{01}<I_0$ and $It_1$ will increase. Conversely, the value $\delta V_{be,q74}$ will be positive (and will be equal to $\delta V_{be,q64}$) because when $Is_2$ decreases, there is more current flow through transistor 74. Consequently, $I_{02}>I_0$ and $It_2$ will decrease.

To calculate the differential offset voltage generated between nodes 46 and 48 when $V_{PIN}=V_{NIN}$=zero volts, the current flowing through resistors 62 and 66 may be expressed as $$I_{01} = It_1 - Is_1 = \frac{VCC - (Vb + V_{be,q68} + \delta V_{be,q68})}{R_{70}} - Is_1 \text{ and}$$

$$I_{02} = It_2 - Is_2 = \frac{VCC - (Vb + V_{be,q74} + \delta V_{be,q74})}{R_{76}} - Is_2$$

Since $V_{in}=V_{be,q60}+\delta V_{be,q60}+I_{01}R_{62}$, and $V_{inb}=V_{be,q64}+\delta V_{be,q64}+I_{02}R_{66}$, the above expressions for $I_{01}$ and $I_{02}$ may be employed, and the offset voltage that appears between the differential outputs 46 and 48 may, therefore, be defined as:

$V_{IN}-V_{INB}=(Is_2-Is_1)R_0+(\delta V_{be,q60}-R_{62}/R_{70}\delta V_{be,q68}-\delta V_{be,q64}+R_{66}/R_{76}\delta V_{be,q74})$ where the emitter areas of $q_{60}$, $q_{64}$, $q_{68}$ and $q_{74}$ are assumed to be equal to one another, and $Is_1$ is the current drawn from VCC through $R_{70}$ that does not travel into the emitter of transistor 68, $Is_2$ is the current drawn from VCC through $R_{76}$ that does not travel into the emitter of transistor 74, and $R_{62}$ equals $R_{66}$, which for convenience will be referred to as $R_0$ ($R_{62}=R_{66}=R_0$). If we assume that $R_{70}=R_{76}$, then the currents may be set such that the errors cancel out of the above equation leaving the term $(Is_2-Is_1)R_0$. This permits the circuit to provide predicable linear responses to changes in the SP and SN inputs. The transistors 60 and 68 must always have substantially the same $V_{be}$ values and $\delta_{be}$ values because they always have substantially the same current flowing in their collectors. The same is true for transistors 64 and 74.

When SP is not equal to SN, then $\delta V_{be,q60}$ must have a polarity that is opposite to $\delta V_{be,q64}$. The same is true for $\delta V_{be,q68}$ and $\delta V_{be,q74}$. Because of these relationships, the terms may not simply cancel by themselves. In order to cause these terms to cancel, $R_0$ must be made equal to $R_{70}$ and $R_{76}$.

A further refinement of the circuit involves the reduction of the errors in the degenerated differential transistor pair $q_{78}$ and $q_{80}$ that are used to generate the differential offset adjust current $(Is_1-Is_2)$. The current $Is_1-Is_2$ is given by $$Is_1 - Is_2 = \frac{2(V(SP) - V(SN))}{re, q_{78} + re, q_{80} + R_{82}}$$

where $re,q_{78}$ equals $kT/qIs_1$, and $re,q_{80}$ equals $kT/qIs_2$ where q is the electronic charge. The resulting offset gain is defined as $$\frac{V(IN) - V(INB)}{V(SP) - V(SN)} = -R_0 \frac{Is_1 - Is_2}{V(SP) - V(SN)} = (-R_0)\frac{2}{re, q_{78} + re, q_{80} + R_{82}}$$

When $Is_1 \gg Is_2$, then $re,q_{78}$ becomes negligible, and $re,q_{80}$ becomes comparable to the required value of $R_{82}$, which introduces significant non-linearity by making the value $(Is_1-Is_2)$ sub-linear to $V(SP)-V(SN)$. In this example, the term $(Is_1-Is_2)R_0$ is less negative than ideally required for linear performance. The typical approach to correcting this is to choose a large bias current Is and only operate over a part of the available range $(V(SP)-V(SN))max=(Is\ R_{82})/2$, where the variation is small. However, if $R_{70}$ is made larger than $R_0$ by a certain amount, then the error may be compensated. When $Is_1>Is_2$, then $\delta V_{be,q60}=\delta V_{be,q68}$ (which is a negative number), and $\delta V_{be,q64}=\delta V_{be,q74}$ (which is a positive number), and $(Is_2-Is_1)\ R_0$ is negative. By making $R_{70}$ somewhat larger than $R_0$, the $\delta V_{be,q60}$ term does not exactly cancel with the $\delta V_{be,q68}$ term. Also, the $\delta V_{be,q64}$ term does not exactly cancel with the $\delta V_{be,q\ 74}$ term. The effect is that the contribution of the $\delta V_{be}$ terms compensate for the fact that the $(Is_1-Is_2)R_0$ term was not negative enough.

Using the above techniques, the gain spread has been simulated to be approximately 2.7% with worst case process, temperature, and supply voltage conditions, and having an offset range of 0 to greater than 100 mv.

Figure 4A:
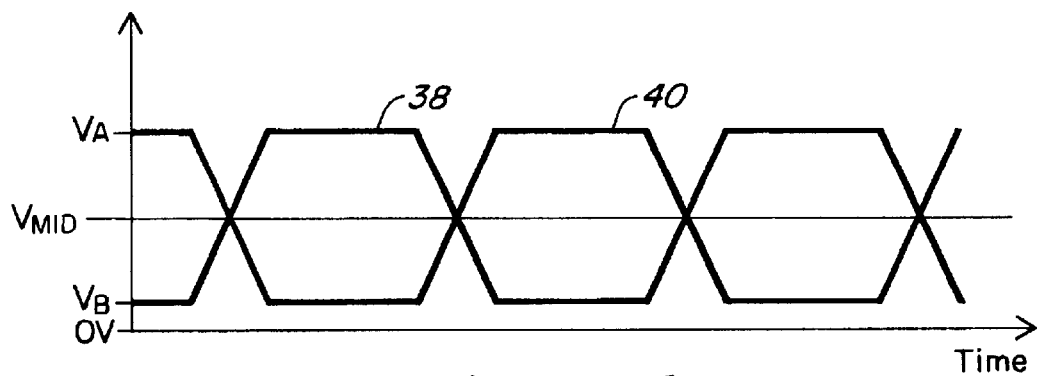
FIGS. 4A–4C show illustrative graphical views of an example of data signals at various nodes in the circuit of FIG. 3.

As shown in FIG. 4A, an example of a differential input signal that may be received at nodes 38 and 40 includes signals that alternate between $V_A$ (e.g., 1.1 volts) and $V_B$ (e.g., 0.1 volts) as shown to provide, for example digital data of alternating binary ones and zeros. The signals at nodes 38 and 40 are shown in FIG. 4A without noise for clarity, and alternate with respect to a middle voltage $V_{MID}$, where $V_{MID}=(V_A-V_B)/2+V_B$.

Figure 4B:
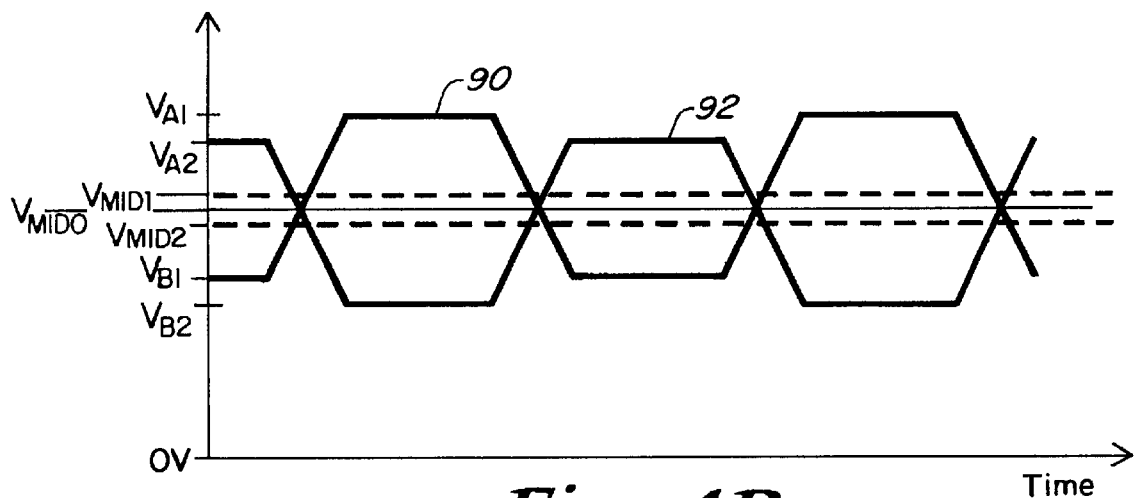

As shown in FIG. 4B, the signal at node 90 associated with the signal 38 of FIG. 4A alternates between voltages $V_{A1}$ and $V_{B1}$, where $V_{A1}=V_A+V_{be,q60}$, and $V_{B1}=V_B+V_{be,q60}$. The signal at node 92 associated with the signal 40 of FIG. 4A alternates between voltages $V_{A2}$ and $V_{B2}$, where $V_{A2}=V_A+V_{be,q64}$, and $V_{B2}=V_B+V_{be,q64}$. If the inputs SP and SN at nodes 42 and 44 are equal to one another, then $V_{be,q60}=V_{be,q64}=V_{be,q60=q64}$ and the middle voltage for signals 90 and 92 are each $V_{MID0}$ as shown where $V_{MID0}=V_{MID}+V_{be,q60=q64}$. As the inputs SP and SN are varied with respect to one another, the middle voltage for the signal 90 is at $V_{MID1}=V_{MID0}+\delta V_{be,q60}$, and the middle voltage for the signal 92 is at $V_{MID2}=V_{MID0}+\delta V_{be,q64}$.

Figure 4C:
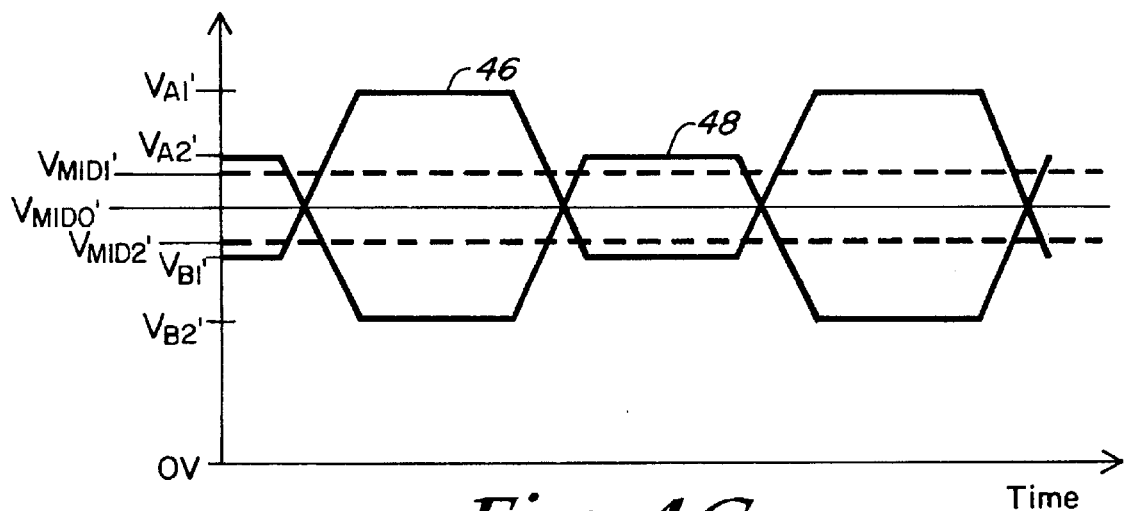

As shown in FIG. 4C, the signal at node 46 associated with the signal 38 of FIG. 4A alternates between voltages $V_{A1}'$ and $V_{B1}'$ where $V_{A1}'=V_A+V_{be,q60}+(I_{01}R_0)$, and $V_{B1}'=V_B+V_{be,q60}+(I_{01}R_0)$. The signal at node 48 associated with the signal 40 of FIG. 4A alternates between voltages $V_{A2}'$ and $V_{B2}'$ where $V_{A2}'=V_A+V_{be,q64}+(I_{02}R_0)$ and $V_{B2}'=V_B+V_{be,q64}+(I_{02}R_0)$. Again, if the inputs SP and SN at nodes 42 and 44 are equal to one another, then $V_{be,q60}=V_{be,q64}=V_{be,q60=q64}$ and $I_{01}=I_{02}=I_0$, then the middle voltage for signals 46 and 48 are each $V_{MIDO}'$ as shown where $V_{MIDO}'=V_{MID}+V_{be,q60=q64}+(I_0R_0)$. As the inputs SP and SN are varied with respect to one another, the middle voltage for the signal 46 is at $V_{MID1}'=V_{MID0}+\delta V_{be,q60}+(I_{01}R_0)$, and the middle voltage for the signal 48 is at $V_{MID2}'=V_{MID0}+\delta V_{be,q64}+(I_{02}R_0)$. The offset voltage, therefore, is the difference between $V_{MID1}'$ and $V_{MID2}'$.

Those skilled in the art will appreciate that numerous modifications and variations may be made to the above embodiments without departing from the spirit and scope of the invention. For example, a wide variety of other types of transistors and other components may be used in addition to those disclosed above, such as the substitution of npn transistors for the pnp transistors disclosed above with the polarity of the circuit reversed.

What is claimed is:

1. An adjustable offset voltage circuit for adjusting voltage levels of each of a positive output signal and a negative output signal relative to each other, said circuit comprising:

first emitter follower means for providing a first offset voltage;

second emitter follower means for providing a second offset voltage;

first current generating means for providing a biasing current to said first emitter follower means;

second current generating means for providing a biasing current to said second emitter follower means;

a pair of differential signal input ports, each of which is coupled to one of said first and second emitter follower means; and offset adjustment means for permitting offset adjustment of the positive output signal and the negative output signal relative to each other.

2. A circuit as claimed in claim 1, where said offset adjustment means includes a degenerated differential pair of transistors.

3. A circuit as claimed in claim 1, wherein said first and second emitter follower means each include a single bi-polar transistor and a series resistor.

4. A circuit as claimed in claim 3, wherein said differential signal input ports are coupled to the bases of the respective bi-polar transistors.

5. A circuit as claimed in claim 1, wherein said first and second current generating means each include a single bi-polar transistor and a series resistor.

6. A circuit as claimed in claim 5, wherein said differential output signal is provided at a pair of differential signal output ports, each of which is coupled to a collector of the bi-polar transistor of one of said first and second current generating means.

7. A circuit as claimed in claim 1, wherein said offset adjustment means is coupled to each of said current generating means.

8. An adjustable offset voltage circuit for adjusting voltage levels of each of a positive output signal and a negative output signal relative to each other, said circuit comprising:

- a first emitter follower unit for providing a first offset voltage, said first emitter follower unit including a single bi-polar transistor;
- a second emitter follower unit for providing a second offset voltage, said second emitter follower unit including a single bi-polar transistor;
- a first current generating unit for providing a biasing current to said first emitter follower unit, said first current generating unit including a single bi-polar transistor;
- a second current generating unit for providing a biasing current to said second emitter follower unit, said second current generating unit including a single bi-polar transistor;
- a pair of differential signal input ports, each of which is coupled to a base of said bi-polar transistor of one of said first and second emitter follower units; and
- an offset adjustment unit for permitting linear offset adjustment of the positive output signal and the negative output signal relative to each other, said offset adjustment unit further including a differential pair of bi-polar transistors.

9. A circuit as claimed in claim 8, wherein each of said differential signal input ports is coupled to a base of the single bi-polar transistor one of said first and second emitter follower units.

10. A circuit as claimed in claim 8, wherein said differential output signal is provided at a pair of differential output signal ports, each of which is coupled to a collector of the single bi-polar transistor of said first and second current generating units.

11. A circuit as claimed in claim 8, wherein said offset adjustment unit further includes a resistor that is coupled at each end to an emitter of one of the pair of bi-polar transistors.

12. A circuit as claimed in claim 8, wherein said offset adjustment unit further includes a pair of adjustment input ports, each of which is coupled to a base of one of the pair of bi-polar transistors.

13. A circuit as claimed in claim 8, wherein each of said first and second emitter follower units, and each of said first and second current generating units includes a single resistor.

14. An adjustable offset voltage circuit for adjusting voltage levels of each of a positive output signal and a negative output signal relative to each other, said circuit comprising:

- a first emitter follower unit for providing a first offset voltage, said first emitter follower unit including a single bi-polar transistor and a single resistor;
- a second emitter follower unit for providing a second offset voltage, said second emitter follower unit including a single bi-polar transistor and a single resistor;
- a first current generating unit for providing a biasing current to said first emitter follower unit, said first current generating unit including a single bi-polar transistor and a single resistor;
- a second current generating unit for providing a biasing current to said second emitter follower unit, said second current generating unit including a single bi-polar transistor and a single resistor;
- a pair of differential signal input ports, each of which is coupled to a base of said bi-polar transistor of one of said first and second emitter follower units; and
- an offset adjustment unit for permitting linear offset adjustment of the positive output signal and the negative output signal relative to each other, said offset adjustment unit further including a differential pair of bi-polar transistors.

15. A circuit as claimed in claim 14, wherein said differential output signals are provided at a pair of differential output signal ports, each of which is coupled to a collector of the bi-polar transistor of one of said first and second current generating units.

16. A circuit as claimed in claim 14, wherein said offset adjustment unit further includes a resistor, each end of which is coupled to an emitter of one of said pair of bi-polar transistors.

17. A circuit as claimed in claim 14, wherein a collector of each of said bi-polar transistors of said offset adjustment unit is coupled to an emitter of the bipolar transistor of one of said first and second current generating units.

18. A circuit as claimed in claim 14, wherein said offset adjustment unit further includes a pair of current sources.

* * * * *